(12) United States Patent
Sung et al.

(10) Patent No.: US 10,629,779 B2
(45) Date of Patent: Apr. 21, 2020

(54) LIGHT-EMITTING DIODE

(71) Applicant: LG INNOTEK CO., LTD., Seoul (KR)

(72) Inventors: Youn Joon Sung, Seoul (KR); Sung Ho Jung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/737,453

(22) PCT Filed: Jul. 7, 2016

(86) PCT No.: PCT/KR2016/007343
§ 371 (c)(1),
(2) Date: Dec. 18, 2017

(87) PCT Pub. No.: WO2017/007246
PCT Pub. Date: Jan. 12, 2017

(65) Prior Publication Data
US 2018/0175249 A1 Jun. 21, 2018

(30) Foreign Application Priority Data
Jul. 9, 2015 (KR) .................. 10-2015-0097806

(51) Int. Cl.
| | |
|---|---|
| *H01L 33/44* | (2010.01) |
| *H01L 33/38* | (2010.01) |
| *H01L 33/20* | (2010.01) |
| *H01L 33/62* | (2010.01) |
| *H01L 33/22* | (2010.01) |

(52) U.S. Cl.
CPC .............. *H01L 33/44* (2013.01); *H01L 33/20* (2013.01); *H01L 33/382* (2013.01); *H01L 33/62* (2013.01); *H01L 33/22* (2013.01); *H01L 2933/0016* (2013.01); *H01L 2933/0025* (2013.01)

(58) Field of Classification Search
None
See application file for complete search history.

(56) References Cited

U.S. PATENT DOCUMENTS

| | | |
|---|---|---|
| 2006/0273335 A1 | 12/2006 | Asahara et al. |
| 2011/0215358 A1 | 9/2011 | Hwang et al. |
| 2014/0138722 A1 | 5/2014 | Yamada et al. |

(Continued)

FOREIGN PATENT DOCUMENTS

| | | |
|---|---|---|
| CN | 103180979 A | 6/2013 |
| CN | 104681576 A | 6/2015 |

(Continued)

*Primary Examiner* — Nishath Yasmeen
(74) *Attorney, Agent, or Firm* — Birch, Stewart, Kolasch & Birch, LLP.

(57) ABSTRACT

A light-emitting diode according to the present invention comprises: a light-emitting structure which includes a first conductive semiconductor layer, an active layer and a second conductive semiconductor layer; passivation layer which protects the light-emitting structure; and a metal layer formed, between the light-emitting structure and the passivation layer, on the light-emitting structure, wherein a distance between the passivation layer and the metal layer is 4 to 12 times greater than the thickness of the passivation layer.

20 Claims, 6 Drawing Sheets

(56) References Cited

U.S. PATENT DOCUMENTS

| | | | | |
|---|---|---|---|---|
| 2014/0312369 A1* | 10/2014 | Yoon | ................ | H01L 33/382 |
| | | | | 257/96 |
| 2016/0351767 A1* | 12/2016 | Choi | ................ | H01L 33/62 |
| 2017/0133563 A1* | 5/2017 | Chung | ................ | H01L 33/56 |

FOREIGN PATENT DOCUMENTS

| | | |
|---|---|---|
| JP | 4976849 B2 | 7/2012 |
| JP | 2014-107291 A | 6/2014 |
| KR | 2001-0004288 A | 1/2001 |
| KR | 10-2008-0001847 A | 1/2008 |
| KR | 10-1021005 B1 | 3/2011 |
| KR | 10-2011-0082865 A | 7/2011 |
| KR | 10-2014-0125521 A | 10/2014 |
| KR | 1020150076571 * | 2/2015 |

* cited by examiner

[FIG. 1]
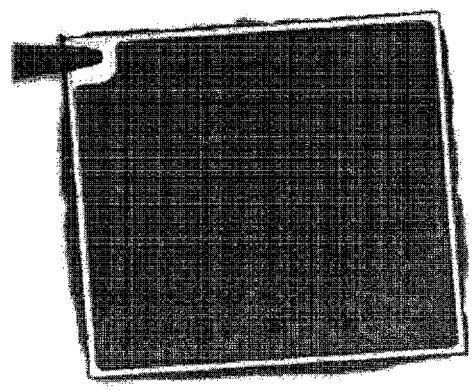
(a)
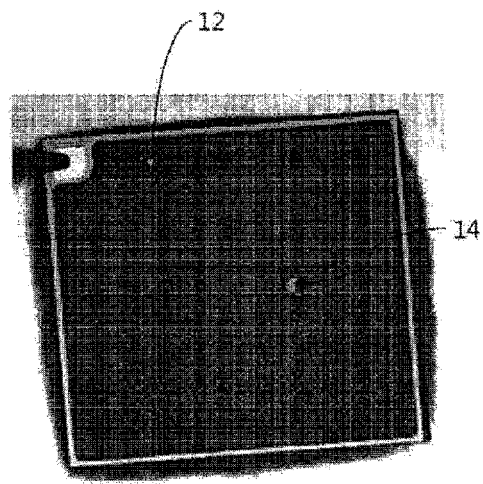
(b)

[FIG. 2]
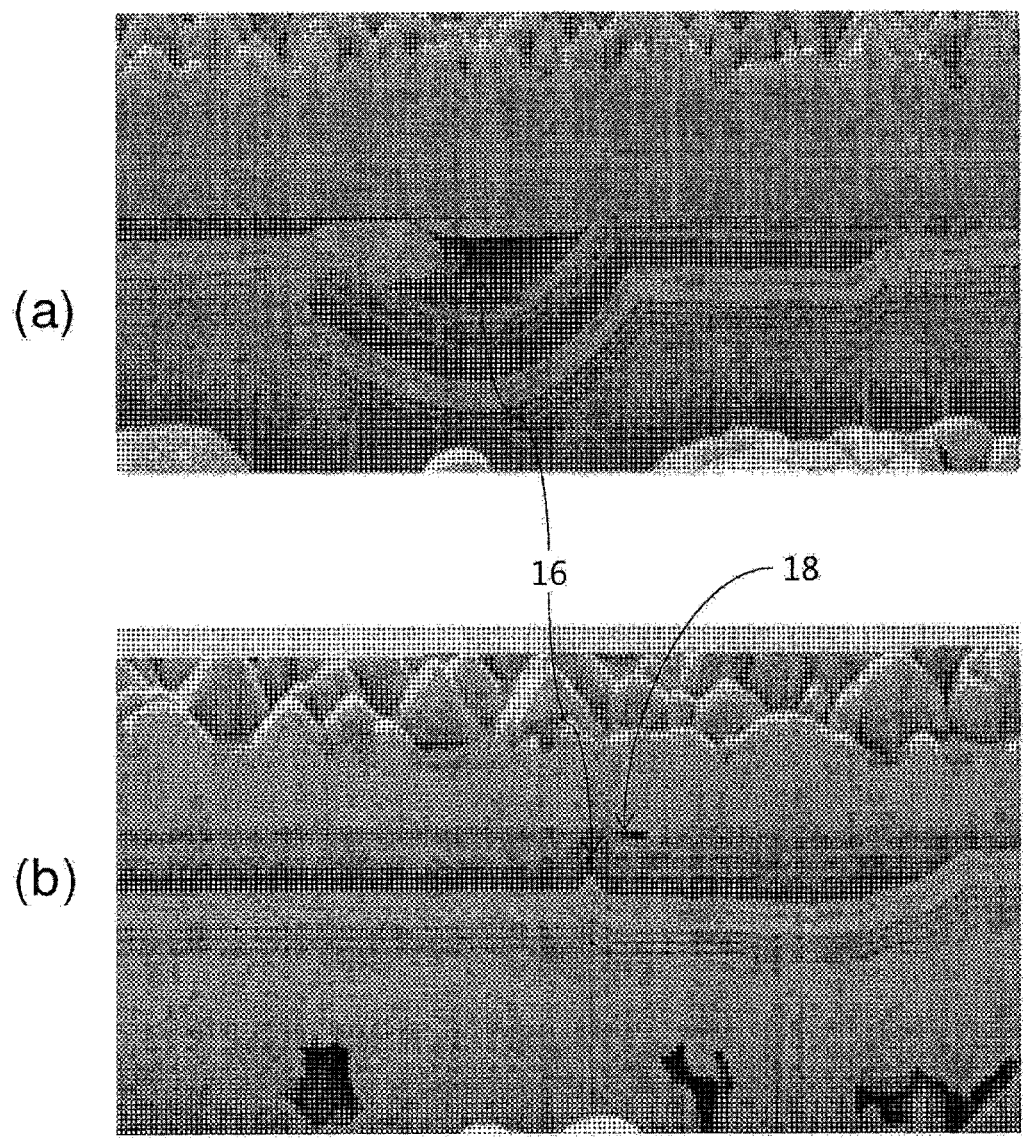

【FIG. 3】
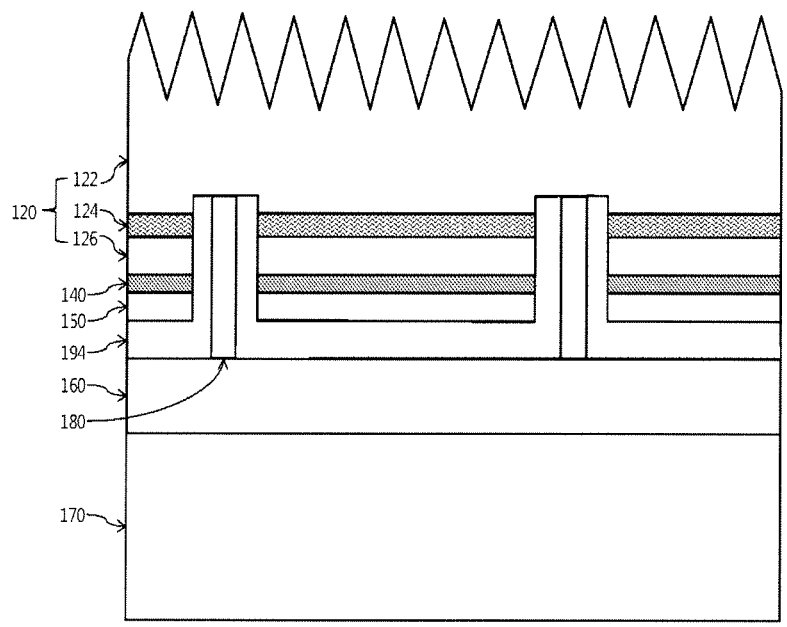
【FIG. 4a】
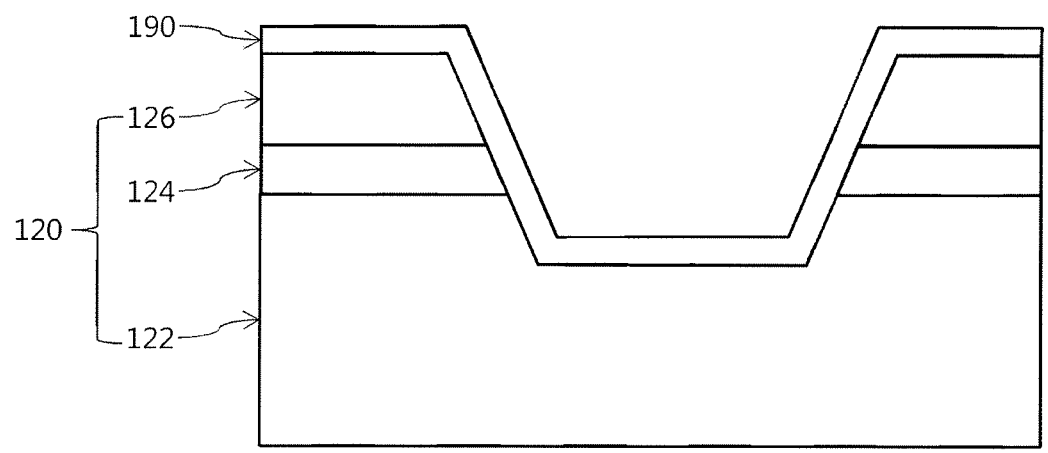

【FIG. 4b】
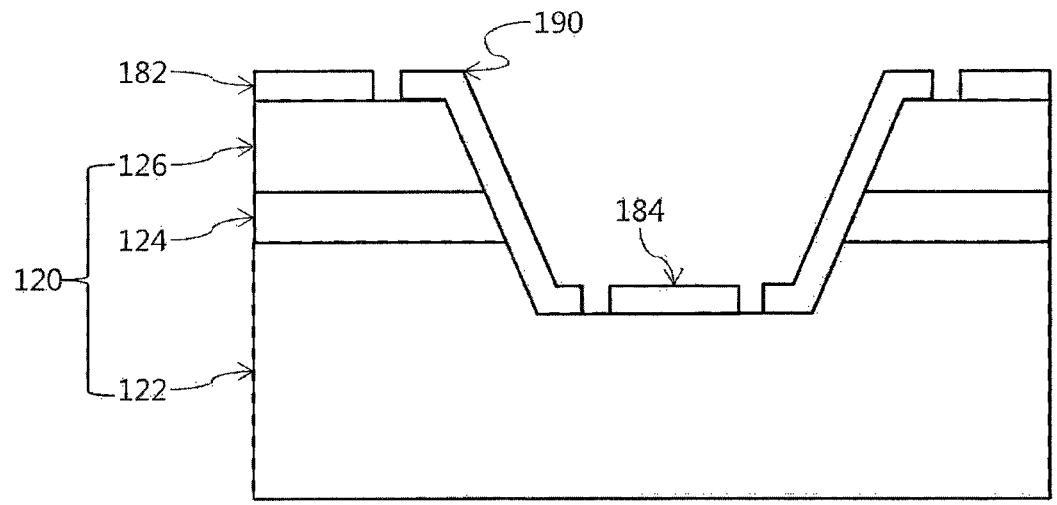
【FIG. 4c】
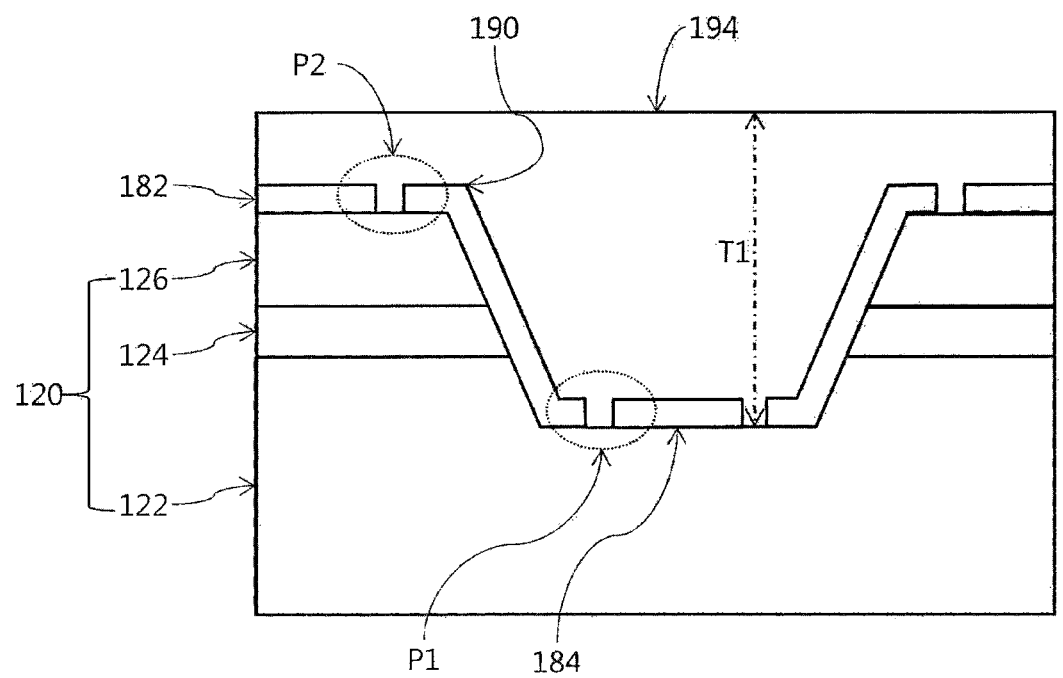

[FIG. 5a]
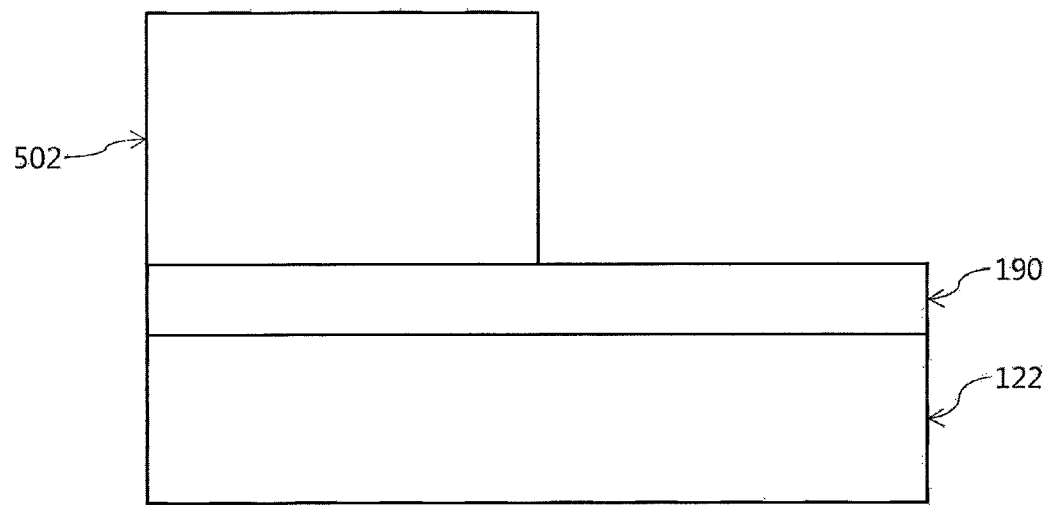
[FIG. 5b]
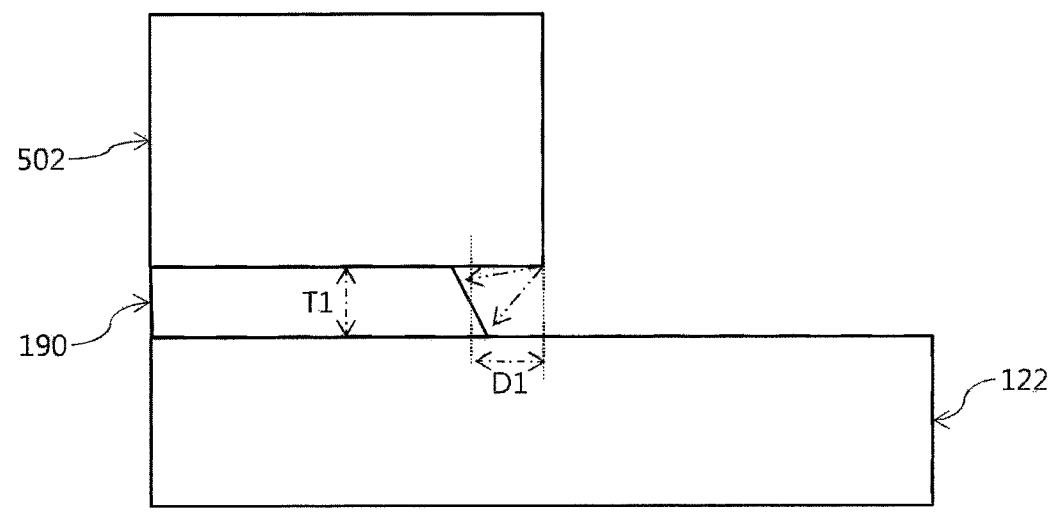

【FIG. 5c】
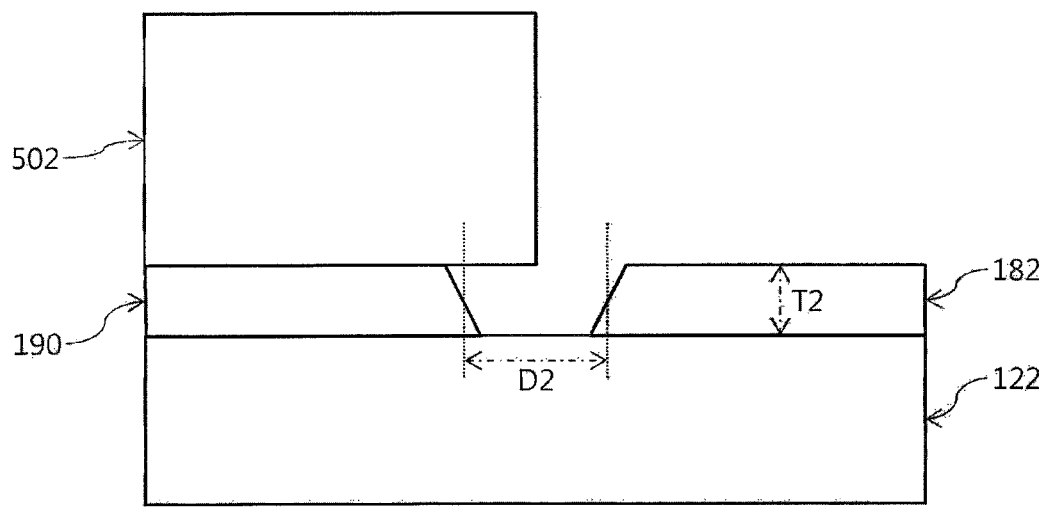
【FIG. 6】
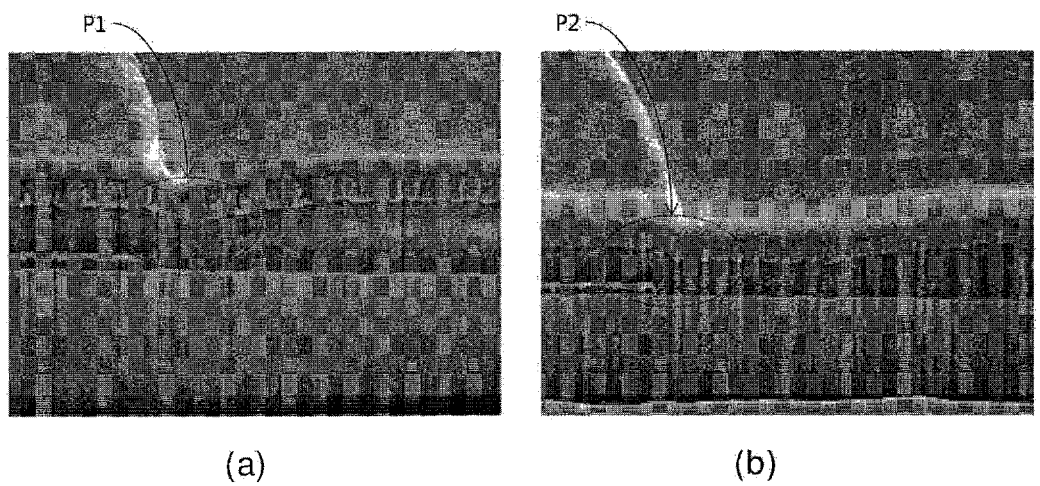
(a)　　　　　　　　　　　　(b)

LIGHT-EMITTING DIODE

CROSS REFERENCE TO RELATED APPLICATIONS

This application is the National Phase of PCT/KR2016/007343 filed on Jul. 7, 2016, which claims priority under 35 U.S.C. § 119(a) to Patent Application No. 10-2015-0097806 filed in the Republic of Korea on Jul. 9, 2015, all of which are hereby expressly incorporated by reference into the present application.

TECHNICAL FIELD

Embodiments relate to a structure of a light emitting diode and a method of manufacturing the same, and more particularly, to a structure of a light emitting device (LED) which blocks leakage current and thus has improved reliability and a method of manufacturing the same.

BACKGROUND ART

As technologies of light emitting diodes (LEDs) have been developed, cost reduction and energy saving are achieved. Further, apparatuses using LEDs have been diversified. Now, LEDs emitting visible light are vigorously applied to various applications including illumination, and ultraviolet (UV) light sources are widely used in science and industry, medicine, environmental science, a semiconductor industry, etc., and application areas thereof will be widened.

Light emitting diodes (an LED or LEDs) are devices which convert electrical energy into light, and an LED generally includes at least one active layer formed of a semiconductor material and interposed between a plurality of layers doped with dopants having opposite electrical characteristics. In general, when bias is applied to both ends of the doped layers, holes and electrons are injected into the active layer and are recombined in the active layer, thus generating light. Such light is emitted from the active layer through the overall surface of the LED.

DISCLOSURE

Technical Problem

Embodiments provide a light emitting diode which reduces leakage current and may thus have improved reliability.

Further, embodiments provide a light emitting diode which blocks leakage current generated between an n-type electrode and a p-type electrode of a vertical light emitting diode and may thus improve a yield.

Further, embodiments provide a light emitting diode in which an insulating film is deposited between a passivation layer and a metal layer without vacant spaces and may thus block leakage current.

Objects of embodiments are not limited to the above-described objects, and additional advantages, objects, and features of the embodiments will be set forth in part in the description which follows and in part will become apparent to those having ordinary skill in the art upon examination of the following or may be learned from practice of the embodiments.

Technical Solution

In one embodiment, a light emitting diode includes a light emitting structure including a first conductivity-type semiconductor layer, an active layer and a second conductivity-type, a passivation layer protecting the light emitting structure, and a metal layer formed between the light-emitting structure and the passivation layer, on the light-emitting structure, wherein a distance between the passivation layer and the metal layer is 4 to 12 times greater than a thickness of the passivation layer.

The light emitting diode may further include an insulating layer deposited on the passivation layer and the metal layer.

A thickness of the insulating layer may be greater than thicknesses of the passivation layer and the metal layer.

The insulating layer may fill gaps formed between the passivation layer and the metal layer, located on the light emitting structure.

The thickness of the insulating layer may be at least 700 nm.

The second insulating layer may be formed by Chemical Vapor Deposition (CVD).

The thicknesses of the metal layer and the passivation layer may be within a range of 400 nm~800 nm.

The distance between the passivation layer and the metal layer may be within a range of 3 mm~5 mm.

The passivation layer and the metal layer may be formed at once by photolithography using one mask.

The distance between the passivation layer and the metal layer may be varied according to an execution time of isotropic etching during photolithography.

The metal layer formed on the light emitting structure may include at least two parts electrically isolated from each other, and the passivation layer may be formed in a region on the light emitting structure not provided with the metal layer.

If an upper surface of the light emitting structure includes flat planes and inclined planes, the metal layer may be formed only on the flat planes and the passivation layer may be formed both on the flat planes and the inclined planes.

The light emitting diode may have vertical structure so that light output from the light emitting structure is emitted in a direction toward an upper surface of the light emitting diode.

Light output from the light emitting structure may be ultraviolet (UV) light having a wavelength range of 100-400 nm.

The above aspects are only some of preferred embodiments, and various embodiments in which technical features of the disclosure are reflected can be devised by those skilled in the art based on a detailed description which will be given below.

Advantageous Effects

A light emitting diode in accordance with one embodiment has effects, as below.

The light emitting diode in accordance with the embodiment suppresses generation of vacant spaces occurring when an insulating film is deposited and may thus block leakage current and improve operation reliability of the light emitting diode.

Effects acquired by embodiments described below are not limited to the above-described effects and it will be understood that other effects can be devised by those skilled in the art that will fall within the spirit and scope of the principles of the disclosure.

DESCRIPTION OF DRAWINGS

The accompanying drawings, which are included to provide a further understanding of embodiments and are incorporated in and constitute a part of this application, illustrate the embodiments and together with the description serve to explain the principle of the embodiments. However, technical characteristics of the embodiments are not limited to the drawings, and characteristics disclosed in the drawings may be combined to constitute new embodiments.

FIG. 1 illustrates defects in a light emitting diode.

FIG. 2 illustrates causes of the defects in the light emitting diode of FIG. 1.

FIG. 3 is a cross-sectional view illustrating a light emitting diode in accordance with one embodiment.

FIGS. 4a to 4c are cross-sectional views illustrating a method of manufacturing the light emitting diode shown in FIG. 3.

FIGS. 5a to 5c are cross-sectional views illustrating the method shown in FIGS. 4b and 4c in more detail.

FIG. 6 illustrates a light emitting diode manufactured by the method of FIGS. 4a to 5c.

DETAILED DESCRIPTION

Hereinafter, devices and methods to which embodiments are applied will be described in detail with reference to the annexed drawings.

In the following description of the embodiments, it will be understood that, when each element is referred to as being formed "on" or "under" another element, it can be directly "on" or "under" the other element or be indirectly formed with one or more intervening elements therebetween. Further, when an element is referred to as being formed "on" or "under" another element, not only the upward direction of the former element but also the downward direction of the former element may be included.

In addition, thicknesses or sizes of respective layers in the drawings may be exaggerated, omitted or schematically illustrated for convenience and clarity of description. Further, sizes of respective elements may not fully represent actual sizes thereof.

FIG. 1 illustrates defects in a light emitting diode. In more detail, FIG. 1a illustrates a light emitting diode package in which no defect occurs, and FIG. 1b illustrates a light emitting diode package in which defects occur. With reference to FIG. 1b, leakage current occurrence spots 12 and 14 are found in the light emitting diode package. FIGS. 1a and 1b are photographs taken by a defect detection apparatus, and an Emission Microscope for Multilayer Inspection (EMMI), which detects a defect by sensing a light change part due by emitting electrons to a defect region under the condition that low voltage is applied thereto, is used as the defect detection apparatus.

FIG. 2 illustrates causes of the defects in the light emitting diode of FIG. 1. In more detail, FIGS. 2a and 2b are photographs of cross-sections of the defects found in FIG. 1b. With reference to FIGS. 2a and 2b, vacant spaces 16 and 18 are formed between a plurality of layers. For example, if the vacant spaces 16 and 18 are formed between a light emitting structure and an insulating layer deposited thereon, the vacant spaces 16 and 18 increase leakage current and lower reliability of the diode.

As exemplarily shown in FIG. 2a, during a wafer bonding process of a high temperature and a high pressure, a bonding material infiltrates the vacant space 16 and separates an n-type metal layer and a gallium nitride (GaN) layer from each other at an interface therebetween. In this case, a region for n-type ohmic contact is decreased and, thus, an operating voltage of the light emitting diode may be increased.

FIG. 2b illustrates a case in which another vacant space 18 is formed at the end of the n-type metal layer around the vacant space 16. In this case, a material forming the n-type metal layer moves to the vacant space 18 and may thus deteriorate operating characteristics of the light emitting diode at a low current and lower operation reliability of the light emitting diode.

The vacant spaces 16 and 18 causing defects in the light emitting diode may be generated, if, when a layer is deposited after formation of a fine pattern during a process of forming a plurality of layers, gaps between the fine pattern are not completely filled with the layer. Further, the vacant spaces 16 and 18 may be generated if a material of a metal layer, which is already formed, is moved due to a semiconductor process carried out at a high temperature and a high pressure, such as the wafer bonding process.

The metal layer also serving as a bonding layer of the light emitting diode may serve as an n-type electrode. If such a bonding metal layer infiltrates the n-type metal layer, an operating voltage may be raised and reliability of the diode may be lowered and, if the bonding metal layer infiltrates a p-type metal layer, short circuit may occur or operating characteristics of the light emitting diode at a low current may be deteriorated. In order to solve these problems, gaps formed between the metal layer and the passivation layer may be completely filled without vacant spaces. When gap-filling characteristics are enhanced, generation of vacant spaces may be prevented.

FIG. 3 is a cross-sectional view illustrating a light emitting diode in accordance with one embodiment.

As exemplarily shown in this figure, a light emitting structure 120 includes a first conductivity-type semiconductor layer 122, an active layer 124 and a second conductivity-type semiconductor layer 126.

An electron blocking layer (not shown) may be arranged between the active layer 124 and the second conductivity-type semiconductor layer 126. The electron blocking layer may be formed to have a superlattice structure and, as the superlattice structure, for example, an AlGaN layer doped with a second conductivity-type dopant may be arranged or a plurality of GaN layers having different aluminum content ratios may be alternately arranged.

The surface of the first conductivity-type semiconductor layer 122 may form a pattern and thus improve light extraction efficiency, and the first conductivity-type semiconductor layer 122 may be connected to a first electrode 180. The first electrode 180 may be formed to have a monolayer or multilayer structure including at least one of aluminum (Al), titanium (Ti), chrome (Cr), nickel (Ni), copper (Cu) or gold (Au).

A second electrode must be arranged under the light emitting structure 120, and an ohmic layer 140 and a reflective layer 150 may serve as the second electrode. A GaN layer is placed under the second conductivity-type semiconductor layer 126 and may thus facilitate supply of current or holes to the second conductivity-type semiconductor layer 126.

The ohmic layer 140 may have a thickness of about 200 angstroms. The ohmic layer 140 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au or Hf, without being limited thereto.

The reflective layer 150 may be formed as a metal layer including molybdenum (Mo), aluminum (Al), silver (Ag), nickel (Ni), platinum (Pt), rhodium (Rh), or an alloy including Al, Ag, Pt or Rh. Aluminum or silver may effectively reflect light emitted by the active layer 124 and thus greatly enhance light extraction efficiency of a semiconductor device, and molybdenum may be favorable for growth of plating in a protrusion, which will be described later.

A support substrate 170 may be formed of a conductive material, such as a metal or a semiconductor material. A metal having excellent electrical conductivity or thermal conductivity may be used as the support substrate 170 and, particularly, the support substrate 170 may sufficiently dissipate heat generated by the semiconductor device during operation and thus be formed of a material having high thermal conductivity (for example, a metal). For example, the support substrate 170 may be formed of one selected from the group consisting of molybdenum (Mo), silicon (Si), tungsten (W), copper (Cu) and aluminum (Al), or an alloy thereof. Further, the support substrate 170 may selectively include gold (Au), a Cu alloy, nickel (Ni), copper-tungsten (Cu—W), and a carrier wafer (for example, GaN, Si, Ge, GaAs, ZnO, SiGe, SiC, SiGe, $Ga_2O_3$, etc.).

The support substrate 170 may have a thickness of 50 to 200 micrometers so as to have sufficient mechanical strength to be divided into separate chips through scribing and breaking processes without bending of an overall nitride semiconductor.

The first electrode 180 and the ohmic layer 140 and the reflective layer 150, serving as the second electrode, are electrically isolated from each other by an insulating film 194.

For example, in order to connect the first conductivity-type semiconductor layer 122 and the first electrode 180, after a hole passing through the active layer 124 and the second conductivity-type semiconductor layer 126 of the light emitting structure 120 or a recess exposing the first conductivity-type semiconductor layer 122 of the light emitting structure 122 is formed, an insulating film 194 is formed on the inner wall of the recess so as to isolate the active layer 124 and the second conductivity-type semiconductor layer 126 from the first electrode 180. Here, the insulating film 194 exposes the first conductivity-type semiconductor layer 122. A conductor forming the first electrode 180 is embedded so as to be connected to the first conductivity-type semiconductor layer 122 exposed through the through hole or the recess, thus forming the first electrode 180.

A bonding layer 160 may bond the insulating film 194 and the support substrate 170 and be formed of one selected from the group consisting of gold (Au), tin (Sn), indium (In), aluminum (Al), silicon (Si), silver (Ag), nickel (Ni) and copper (Cu), or an alloy thereof. The bonding layer 160 may be connected to the first electrode 180 and supply electrons to the first conductivity-type semiconductor layer 122.

Further, a passivation layer (not shown) may be formed at at least a part of the side and lower surfaces of the light emitting structure 120. The passivation layer may protect the light emitting structure and prevent generation of interlayer electrical short circuit. The passivation layer may be formed of an insulating material, such as an oxide or a nitride and, for example, be formed as a silicon oxide ($SiO_2$) layer, an oxynitride layer or an aluminum oxide layer.

FIGS. 4a to 4c are cross-sectional views illustrating a method of manufacturing the light emitting diode shown in FIG. 3.

With reference to FIG. 4a, the light emitting structure 120 includes the first conductivity-type semiconductor layer 122, the active layer 124 and the second conductivity-type semiconductor layer 126, and is mesa-etched so that the first conductivity-type semiconductor layer 122 is exposed. The passivation layer is formed on the mesa-etched light emitting structure 120. With reference to FIG. 4b, the first conductivity-type semiconductor layer 122 and the second conductivity-type semiconductor layer 126 are exposed and a second ohmic contact layer 184 connected to the first electrode 180 (with reference to FIG. 3) and a first ohmic contact layer 182 connected to the ohmic layer 140 (with reference to FIG. 3) functioning as the second electrode are formed by patterning the passivation layer 190.

With reference to FIG. 4c, the insulating film 194 is deposited on the passivation layer 190, the first ohmic contact layer 182 and the second ohmic contact layer 184. Here, a thickness of the insulating film 194 must be 700 nm or more. The reason for this is to electrically isolate two electrodes (i.e., an n-type electrode and a p-type electrode) in a vertical light emitting diode having the structure of FIG. 3. If the thickness of the insulating film 194 is decreased, leakage current is increased and thus the yield of the light emitting diode may be reduced.

When the insulating film 194 is deposited, if a first gap P2 between the passivation layer 190 and the first ohmic contact layer 182 and a second gap P1 between the passivation layer 190 and the second ohmic contact layer 184 are not filled with the insulating film 194, vacant spaces may be generated in the first gap P1 and the second gap P2. Such vacant spaces may increase leakage current, as described above with reference to FIG. 2. The vacant spaces are generated due to small widths of the first gap P1 and the second gap P2.

For example, as exemplarily shown in FIG. 4a, at least one recess or trench formed through the first conductivity-type semiconductor layer 122, the active layer 124 and the second conductivity-type semiconductor layer 126 and extending to a part of the first conductivity-type semiconductor layer 122 may be formed. Thereafter, a first electrode layer, for example, the second ohmic layer 184, conductively connected to a first insulating layer arranged at the lower portion of the first conductivity-type semiconductor layer, for example, the passivation layer 190, and the first conductivity-type semiconductor layer 122, may be formed in the recess or the trench. Here, a distance between the first insulating layer and the first electrode layer may be 4 to 12 times greater than the thickness of the first insulating layer, and a second insulating, for example, the insulating film 194, may be arranged between the first insulating layer and the first electrode layer.

FIGS. 5a to 5c are cross-sectional views illustrating the method shown in FIGS. 4b and 4c in more detail.

With reference to FIG. 5a, in order to pattern the insulating layer, i.e., the passivation layer 190, a photosensitive pattern 502 is formed.

With reference to FIG. 5b, the passivation layer 190 exposed between the photosensitive pattern 502 is removed by performing wet etching using the photosensitive pattern 502 as a mask. Here, wet etching has isotropic etching properties and, thus, an undercut may occur under the photosensitive pattern 502. A depth D1 of the undercut may be adjusted by adjusting a time of wet etching. Here, wet etching may be performed such that the depth D1 of the undercut is about 10 times greater than a thickness T1 of the passivation layer 190.

With reference to FIG. 5c, after formation of the undercut, the first ohmic contact layer 182 is formed. Here, a distance D2 between the first ohmic contact layer 182 and the passivation layer 190 may be 4 to 12 times greater than the thickness T1 of the passivation layer 190. Particularly, the distance D2 between the first ohmic contact layer 182 and the passivation layer 190 may be 5 to 10 times greater than the thickness T1 of the passivation layer 190.

If the distance D2 between the first ohmic contact layer 182 and the passivation layer 190 is less than 4 times the thickness T1 of the passivation layer 190, the gap P1 (with reference to FIG. 4*c*) is excessively narrow and thus a vacant space which is not filled with the insulating film 194 may occur.

Further, if the distance D2 between the first ohmic contact layer 182 and the passivation layer 190 may exceed 12 times the thickness T1 of the passivation layer 190, a process burden, i.e., formation of an excessive undercut, may occur. Further, in order to form the excessive undercut, a time of wet etching is increased and, thus, a part of the light emitting structure 120 protected by the passivation layer 190 may be etched.

A thickness T2 of the first ohmic contact layer 182 may be similar to the thickness T1 of the passivation layer 190. For example, the thickness T1 of the passivation layer 190 and the thickness T2 of the first ohmic contact layer 182 may be within a range of about 400 nm~800 nm. In this case, the distance D2 between the first ohmic contact layer 182 and the passivation layer 190 may be determined within a range of about 3 μm~5 μm.

Particularly, the distance D2 between the first ohmic contact layer 182 and the passivation layer 190 may be 3 μm. Here, it the distance D2 is 5 μm or more, a contact area of the first ohmic contact layer 182 is decreased and, thus, light output of the light emitting diode may be decreased and operating voltage of the light emitting diode may be raised.

Although FIGS. 5*a* to 5*c* exemplarily describe the passivation layer 190 and the first ohmic contact layer 182, such a description may be applied to the passivation layer 190 and the second ohmic contact layer 186.

Further, the thickness T1 or T2 of the passivation layer 190, the first ohmic contact layer 182 or the second ohmic contact layer 186 may not exceed 800 nm. Particularly, light output of the light emitting diode may be enhanced as the thickness T1 or T2 is decreased, and the thickness T1 or T2 may be 600 nm or less. The bonding metal may be melted or diffused during the wafer bonding process of a high temperature and a high pressure and, if the thickness T1 or T2 is large, vacant spaces may be caused after bonding. Such vacant spaces lower reliability of the light emitting diode. Therefore, in order to prevent deterioration of performance of the light emitting diode caused by the wafer bonding process, the thickness T1 or T2 may be small and thus the insulating film 194 may be deposited without vacant spaces. Use of chemical vapor deposition (CVD) using high density plasma (HDP) having high particle energy may be favorable for deposition of the insulating film 194.

FIG. 6 illustrates a light emitting diode manufactured by the method of FIGS. 4*a* to 5*c*.

With reference to FIGS. 6*a* and 6*b*, a first gap P1 and a second gap P2 in the light emitting diode are completely filled with an insulating film without vacant spaces. Such a light emitting diode may suppress leakage current and reduce lowering of reliability of the diode due to diffusion of a bonding metal.

Light output from a light emitting structure of a light emitting diode in accordance with one embodiment may be ultraviolet (UV) light having a wavelength range of 100-400 nm. Such an ultraviolet LED may be applied to apparatuses having a sterilizing function. For example, all apparatuses having a sterilizing function, such as an air cleaner, a humidifier, a water purifier, etc., which may be used in homes and industrial sites, may include an ultraviolet LED.

Although embodiments have been described with reference to a number of illustrative embodiments thereof, it should be understood that numerous other modifications and embodiments can be devised by those skilled in the art that will fall within the spirit and scope of the principles of the disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Although the preferred embodiments have been disclosed for illustrative purposes, those skilled in the art will appreciate that various modifications, applications, additions and substitutions are possible, without departing from the scope and spirit of the disclosure. For example, respective elements of the embodiments may be modified. Further, it should be understood that differences regarding the modifications and applications are within the spirit and scope of the disclosure which is defined in the appended claims and their equivalents.

The invention claimed is:

1. A light emitting diode comprising:
   a substrate;
   a light emitting structure comprising a first conductivity-type semiconductor layer, an active layer and a second conductivity-type semiconductor layer, arranged in a first direction on the substrate;
   at least one recess formed through the active layer and the second conductivity-type semiconductor layer and extending at least partially into a portion of the first conductivity-type semiconductor layer;
   a first insulating layer comprising a first portion disposed on a top surface of the second conductivity-type semiconductor layer, a second portion disposed on a side of the at least one recess and a third portion extending in a second direction from the second portion and disposed on a bottom surface of the at least one recess and contacting at least a lower portion of the first conductivity-type semiconductor layer within the at least one recess;
   a first ohmic contact layer conductively connected to the second conductivity-type semiconductor layer;
   a first electrode including a second ohmic contact layer conductively connected to the first conductivity-type semiconductor layer within the at least one recess;
   a second insulating layer disposed on the first insulating layer and the light emitting structure;
   a first gap extending in the second direction between an edge of the second ohmic contact layer and an edge of the third portion of the first insulating layer, a width of the first gap in the second direction having a first distance that is 4 to 12 times greater than a height in the first direction of the first insulating layer; and
   a second gap extending in the second direction between an edge the first ohmic contact layer and an edge the first portion of the first insulating layer, a width in the second direction of the second gap having a second distance that is 4 to 12 times greater than the height of the first insulating layer,
   wherein the second insulating layer includes an upper portion that contacts the second conductivity-type semiconductor layer and fills the second gap between the first ohmic contact layer and the first insulating layer, and wherein the second insulating layer includes a lower portion that contacts the first conductivity-type semiconductor layer and fills the first gap between second ohmic contact layer and the first insulating layer.

2. The light emitting diode according to claim 1, wherein the second insulating layer is deposited across the first insulating layer, the first ohmic contact layer and the second ohmic contact layer.

3. The light emitting diode according to claim 2, wherein a height in the second direction of the second insulating layer is greater than the height of the first insulating layer, and wherein the height of the second insulating layer is greater than each of a height in the second direction of the first ohmic contact layer and a height of the second ohmic contact layer.

4. The light emitting diode according to claim 3, wherein the height of the second insulating layer is at least 700 nm.

5. The light emitting diode according to claim 3, wherein the second insulating layer extends into the recess.

6. The light emitting diode according to claim 1, wherein heights in the first direction of each of the first and second ohmic layers and the first insulating layer are within a range of 400 nm~800 nm.

7. The light emitting diode according to claim 1, wherein each of the first and second distances is within a range of 3 mm~5 mm.

8. The light emitting diode according to claim 1, wherein the first insulating layer and the first and second ohmic contact layers are formed at once by photolithography using one mask.

9. The light emitting diode according to claim 8, wherein the first and second distances are varied according to an execution time of isotropic etching during photolithography.

10. The light emitting diode according to claim 1, wherein an upper surface of the light emitting structure comprises flat planes and inclined planes, the first and second ohmic contact layers are formed only on the flat planes and the first insulating layer is formed both on the flat planes and the inclined planes.

11. The light emitting diode according to claim 1, having a vertical structure so that light output from the light emitting structure is emitted in a direction toward an upper surface of the light emitting diode.

12. The light emitting diode according to claim 1, wherein light output from the light emitting structure is ultraviolet (UV) light having a wavelength range of 100-400 nm.

13. A light emitting diode comprising:
a substrate;
a light emitting structure comprising a first conductivity-type semiconductor layer, an active layer and a second conductivity-type semiconductor layer, arranged in a first direction on the substrate;
at least one recess formed through the active layer and the second conductivity-type semiconductor layer and extending at least partially into a portion of the first conductivity-type semiconductor layer;
a first insulating layer comprising a first portion disposed on a top surface of the second conductivity-type semiconductor layer, a second portion disposed on a side of the at least one recess and a third portion extending in a second direction from the second portion and disposed on a bottom surface of the at least one recess and contacting at least a lower portion of the first conductivity-type semiconductor layer within the at least one recess;
a first ohmic contact layer conductively connected to the second conductivity-type semiconductor layer;
a first electrode including a second ohmic contact layer conductively connected to the first conductivity-type semiconductor layer within the at least one recess;
a second insulating layer disposed on the first insulating layer and the light emitting structure;
a first gap extending in the second direction between an edge of the second ohmic contact layer and an edge of the third portion of the first insulating layer, a width in the second direction of the first gap having a first distance that is 4 to 12 times greater than a height in the first direction of the first insulating layer; and
a second gap extending in the second direction between an edge of the first ohmic contact layer and an edge of the first portion of the first insulating layer, a width in the second direction of the second gap having a second distance that is 4 to 12 times greater than the height of the first insulating layer,
wherein the second insulating layer includes an upper portion overlapping the second conductivity-type semiconductor layer and fills the second gap between the first ohmic contact layer and the first insulating layer, and
wherein the second insulating layer includes a lower portion overlapping the first conductivity-type semiconductor layer and fills the first gap between second ohmic contact layer and the first insulating layer.

14. The light emitting diode according to claim 13, wherein the second insulating layer is deposited across the first insulating layer and the first and second ohmic contact layers.

15. The light emitting diode according to claim 14, wherein a height in the first direction of the second insulating layer is greater than the height of the first insulating layer, and wherein the height of the second insulating layer is greater than each of a height in the first direction of the first ohmic contact layer and a height in the first direction of the second ohmic contact layer.

16. The light emitting diode according to claim 15, wherein the height of the second insulating layer is at least 700 nm.

17. The light emitting diode according to claim 13, wherein heights in the first direction of each of the first and second ohmic contact layers and the first insulating layer are within a range of 400 nm~800 nm.

18. The light emitting diode according to claim 13, wherein each of the first and second distances is within a range of 3 mm~5 mm.

19. The light emitting diode according to claim 13, wherein an upper surface of the light emitting structure comprises flat planes and inclined planes, the first and second ohmic contact layers are formed only on the flat planes and the first insulating layer is formed both on the flat planes and the inclined planes.

20. The light emitting diode according to claim 13, wherein light output from the light emitting structure is ultraviolet (UV) light having a wavelength range of 100-400 nm.

* * * * *